United States Patent
Drobnis et al.

(10) Patent No.: US 6,781,156 B2
(45) Date of Patent: Aug. 24, 2004

(54) RECOMBINATION CENTER DIFFUSION CONTROLLED BY CARBON CONCENTRATION

(75) Inventors: Miron Drobnis, Manchester (GB); Martin J. Hill, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/315,804

(22) Filed: Dec. 10, 2002

(65) Prior Publication Data

US 2003/0127645 A1 Jul. 10, 2003

(30) Foreign Application Priority Data

Dec. 15, 2001  (GB) ............................................. 0130018

(51) Int. Cl.⁷ ......................................... H01L 31/0312
(52) U.S. Cl. ........................ 257/77; 257/330; 257/687; 257/746; 257/774; 438/105; 438/931
(58) Field of Search ............................ 257/44, 77, 330, 257/675, 687, 746, 758, 774; 438/105, 931

(56) References Cited

U.S. PATENT DOCUMENTS 4,478,655 A * 10/1984 Nagakubo et al. .......... 438/151
4,754,315 A * 6/1988 Fisher et al. ................. 257/583
2003/0094650 A1 * 5/2003 Huang et al. ................ 257/330

FOREIGN PATENT DOCUMENTS

| DE | 10014659 | 10/2001 | .......... H01L/27/08 |
| EP | 1098371 | 5/2001 | .......... H01L/29/06 |

OTHER PUBLICATIONS

Baliga, IDS Reference AL, pp. 170 and 330.*
Hill et al., IDS Reference AM*
"Power Semiconductor Devices" by Baliga, pp 153–182, 322–331.
"Influence of Carbon Concentration on Gold Diffusion in Silicon" by M. Hill and P. Iseghem, Proceedings of the Third International Symposium on Silicon . . . of the Electrochemical Society, 1977, vol. 77–2, pp 715–725.

* cited by examiner

Primary Examiner—Nathan J. Flynn
Assistant Examiner—Scott R Wilson
(74) Attorney, Agent, or Firm—Aaron Waxler

(57) ABSTRACT

A localised reduced lifetime region (1,25,41) is provided in a semiconductor device formed substantially of silicon. A predetermined concentration of carbon is provided in the region, and then the body is heated to incorporate a lifetime controlling impurity substantially within the carbon region. It is believed that the association between the impurity ions ($M^+$) and the carbon atoms (C) on silicon lattice sites produces $C-M^+$ complexes with significant capture cross-sections. The carbon may be provided by addition during epitaxial growth of silicon material, during bulk growth of the silicon, or by implantation and/or diffusion.

12 Claims, 2 Drawing Sheets

RECOMBINATION CENTER DIFFUSION CONTROLLED BY CARBON CONCENTRATION

The present invention relates to semiconductor devices and their manufacture, and more particularly to the incorporation of charge carrier lifetime controlling impurities into semiconductor power devices.

In many types of semiconductor devices, it is, desirable to provide localised areas with short carrier lifetimes relative to the remainder of the device. This may be achieved by the introduction of recombination centres. Two methods typically used are the diffusion of lifetime controlling impurities such as gold or platinum and high energy particle irradiation. However, it is difficult to control the recombination centre distribution obtained by diffusion of gold or platinum and it generally results in less than optimal "bath tub" concentration profiles with few recombination centres deep in the structure. The recombination centres produced using irradiation are mainly restricted to surface regions of the device. Also, the lattice damage caused by the high energy irradiation needed to create deep recombination centres is susceptible to annealing by subsequent heating even at low temperatures, which may reduce the long term stability of the device. A localised short carrier lifetime region well below the surface is therefore difficult to obtain using either method. Furthermore, neither approach is suited to lateral masking because of the inevitable lateral spread during diffusion, and because any radiation that is energetic enough to penetrate deep into the silicon is hard to mask. Thus lateral confinement of the recombination centres is problematic using either process.

An example of a device in which a localised distribution of recombination centres would be particularly beneficial is the P-i-N rectifier. Such devices are discussed, for example, in "Power Semiconductor Devices" by B. Jayant Baliga (1995), (hereinafter referred to as "Baliga"), at pages 153 to 182, the contents of which are hereby incorporated herein as reference material. Lifetime control is described on pages 175 to 177 thereof, where it is noted that a narrow distribution of recombination centres gives an improved trade-off between forward drop and reverse recovery speed. However, it is acknowledged that it is difficult to achieve such a distribution using the methods discussed above. There has thus been a long-standing and widely recognised need for a viable solution to this problem.

The article "Influence of Carbon Concentration on Gold Diffusion in Silicon" by M. J. Hill (one of the present inventors) and P. M. Van Iseghem, published in the Proceedings of the Third International Symposium on Silicon Materials Science and Technology of the Electrochemical Society, 1977, Vol. 77-2, pages 715 to 725, investigated the homogeneity of gold diffusion in thick silicon slices for power devices. The distribution of diffused gold had been found to depend on many factors, including the source of the silicon. In the article, it is suggested that variations in carbon concentration across the silicon influence the gold distribution and that carbon levels varied within the same grade of FZ silicon and also between silicon from different manufacturers.

It is an object of the present invention to provide improved control over the incorporation of lifetime controlling impurities into semiconductor devices.

The present invention provides a semiconductor device having a semiconductor body formed substantially of silicon, the body containing an active device area in which charge carriers flow during operation of the device, and the active device area including a region having a predetermined concentration of carbon, wherein a lifetime controlling impurity is provided in the body which is substantially located in the carbon region. The inventors unexpectedly found that by introducing a predetermined concentration of carbon into a localised region of the active area of a device where a reduced carrier lifetime is desired, it is possible to closely control the distribution of a lifetime controlling impurity there, substantially restricting it to a predefined location. This enables much greater control over carrier lifetime in different regions of device structures and therefore their operating characteristics and uniformity.

The carbon atoms occupy lattice sites in the silicon of the semiconductor body. Although these atoms are electrically neutral, the inventors believe that when larger impurity atoms such as gold or platinum are introduced it is energetically favourable for these impurities to occupy lattice sites adjacent to the smaller carbon atoms to reduce local lattice strain. The impurity becomes associated with the predetermined concentration of carbon. It is thought by the inventors that the association between the impurity ions ($M^+$) and the carbon atoms (C) on lattice sites produces $C-M^+$ complexes with significant capture cross-sections.

Typically, the concentration profile of the impurity in the carbon region substantially corresponds to that of the carbon, the carbon profile being predetermined and controlled. Thus, the carbon may be employed to impose a specific profile on the impurity, according to the requirements of a particular device configuration. The extent to which the impurity is taken up by the carbon region may be controlled by careful control of the temperature the device is exposed to during its manufacture. Temperatures lower than normally used for diffusion of a lifetime controlling impurity may be sufficient to achieve the desired result owing to the association between the carbon atoms and the impurity. The reduced temperatures may provide a more confined overall impurity distribution.

The carbon may be substantially laterally and/or vertically confined within the semiconductor body.

The invention further provides a method of manufacturing a semiconductor device having a semiconductor body formed substantially of silicon, the body containing an active device area in which charge carriers flow during operation of the device, the method comprising the steps of providing a region in the active device area having a predetermined concentration of carbon, and heating the body such that a lifetime controlling impurity within the body becomes substantially located in the carbon region.

The carbon region may retain one or more lifetime controlling impurities. The "background" level of the one or more impurities generally present in a high temperature furnace (diffusing from the internal walls, for example) may be sufficient that the concentration thereof caused by the carbon provides the desired degree of localised lifetime control. Otherwise, the method may include the step of actively introducing the lifetime controlling impurity into the body prior to the heating step.

The heating step may be carried out specifically to associate the impurity with the carbon region, or it may form part of another process, later in the fabrication of the device.

Carbon atoms may be provided in the semiconductor body of a device in several ways. For example, they may be implanted and/or diffused in the body, before, during and/or after other high temperature processes. A mask may be used to laterally confine the implantation or to restrict the surface area exposed during diffusion of impurities into the body. Preferably, it is introduced during growth of an epitaxial layer of silicon. This approach is relatively low cost, and the distribution (that is, the concentration) of the added carbon vertically, and laterally where appropriate, can be accurately controlled and may be restricted to a well defined, discrete region or regions. In a further technique, the carbon is incorporated uniformly during bulk growth of a silicon substrate. It may then provide greater control over the subsequent diffusion, and thus distribution, of a lifetime controlling impurity.

Thus, using the techniques described herein, it is possible to introduce carbon into the semiconductor body of a device in a predetermined and controlled manner, to produce a desired carbon concentration profile in a localised region in the active area of the device. It may be preferable to add the impurity relatively late in the manufacturing sequence to minimise any alteration of its distribution by subsequent processes, although pinning of the impurity by the carbon will tend to reduce its susceptibility to movement by later heating.

An embodiment of the invention will now be described by way of example and with reference to the accompanying schematic drawings, wherein.

Figure 1:
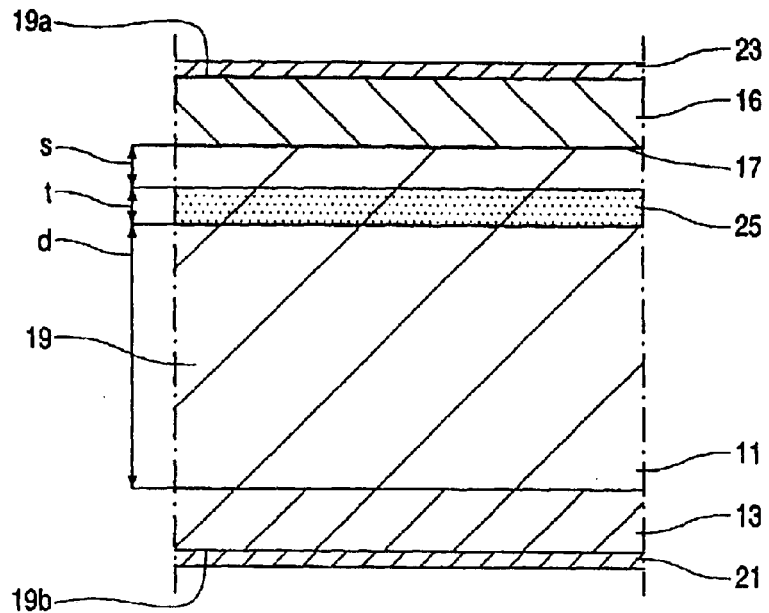
FIG. 1 is a cross-sectional view of a rectifier area of a semiconductor body in accordance with the invention.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

FIG. 1 illustrates a power rectifier which embodies the present invention. A lightly doped, epitaxial silicon layer 11 of a first conductivity type (n-type in this example) is provided over a heavily doped monocrystalline silicon substrate 13, also of the first conductivity type. Layer 16 is heavily doped with a dopant of the opposite, second conductivity type (here it is p-type), to form a p-n junction 17. Electrodes are provided over the top and bottom major surfaces 19a, 19b, respectively, above and below the semiconductor body 19, with electrode 21 forming the cathode and electrode 23 the anode in this example.

A laterally extending region or layer 25 is provided below and spaced from the p-n junction 17 which has a higher concentration of carbon and gold atoms than the remainder of the rectifier area. This low lifetime region close to the p-n junction serves to accelerate the recombination process at turn-off, whilst affecting the forward voltage drop of the device substantially less than a homogeneous gold distribution.

Typically, the carbon concentration in the region 25 is of the order of $10^{12}$ to $10^{16}$ atoms/cm$^3$. Gold atoms are present in the region in a concentration of the order of $10^{11}$ to $10^{13}$ atoms/cm$^3$, for example.

A method of manufacturing the device shown in FIG. 1 will now be described. Layer 11 is grown epitaxially over the substrate 13. Its thickness depends on the reverse voltage rating of the device, and may typically be in the range of about 5 to 100 microns or more. During this process, once the thickness of layer 11 has reached a distance d above the substrate, carbon atoms are incorporated into the layer as its growth progresses, until the thickness of layer 11 is increased by an amount t. Thickness t may be around 5 microns for example. The formation of the semiconductor body 19 is then completed without the addition of carbon. Dopant of the second conductivity type may then be diffused into the semiconductor body 19 through the top major surface 19a to form layer 16. The distance s between the p-n junction 17 and the carbon region 25 may typically be around 0 to 10 microns.

Subsequently, gold atoms are diffused into the semiconductor body 19. Alternatively, the gold diffusion may be carried out simultaneously with diffusion of the second conductivity type dopant. The carbon atoms present in the body "pin" gold atoms within region 25 so that the gold is substantially localised over a predetermined depth range. Finally, the electrodes 21 and 23 are formed over the top and bottom major surfaces 19a, 19b respectively using known techniques.

Figure 2:
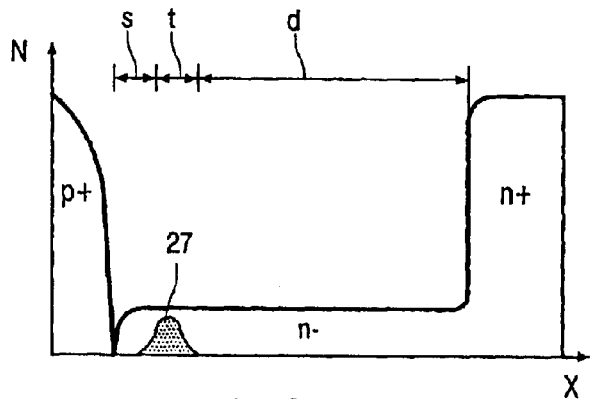
FIG. 2 is a vertical doping profile of the rectifier area of FIG. 1.
Figure 3:
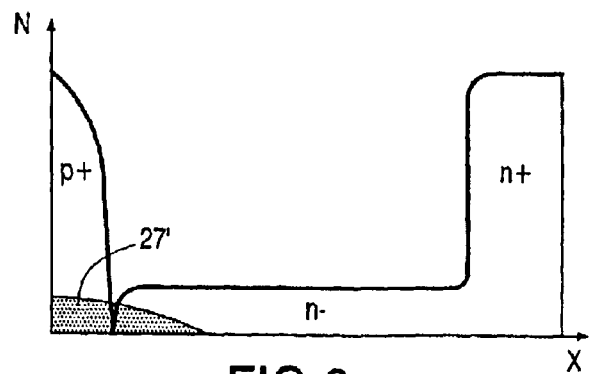
FIG. 3 is an alternative rectifier doping profile to that of FIG. 2, according to another embodiment of the invention.

FIG. 2 shows an approximate vertical doping profile through the semiconductor body 19 of the power rectifier of FIG. 1, with the nett number of dopant atoms per unit volume, N, plotted against the vertical distance, x, from the top major surface 19a. The location of region 25 is indicated by shaded region 27 in FIG. 2 within the lightly doped n– portion of the epitaxially grown silicon layer. Region 27 represents the concentration of carbon atoms in the body FIG. 3 shows a similar doping profile to that of FIG. 2, having an alternative profile for the shaded region 27' doped with carbon atoms. In this embodiment, both the carbon and gold atoms are diffused from the top major surface 19a of the semiconductor body 19. The region 27' extends from the top major surface to a depth below the p-n junction of the device.

Whilst the rectifier described above has a p-type layer overlying an n-type drift region, the device may be manufactured with these conductivity types interchanged. However, due to the higher mobility of electrons, an n-type drift region is generally preferable to provide better forward recovery characteristics.

Figure 4:
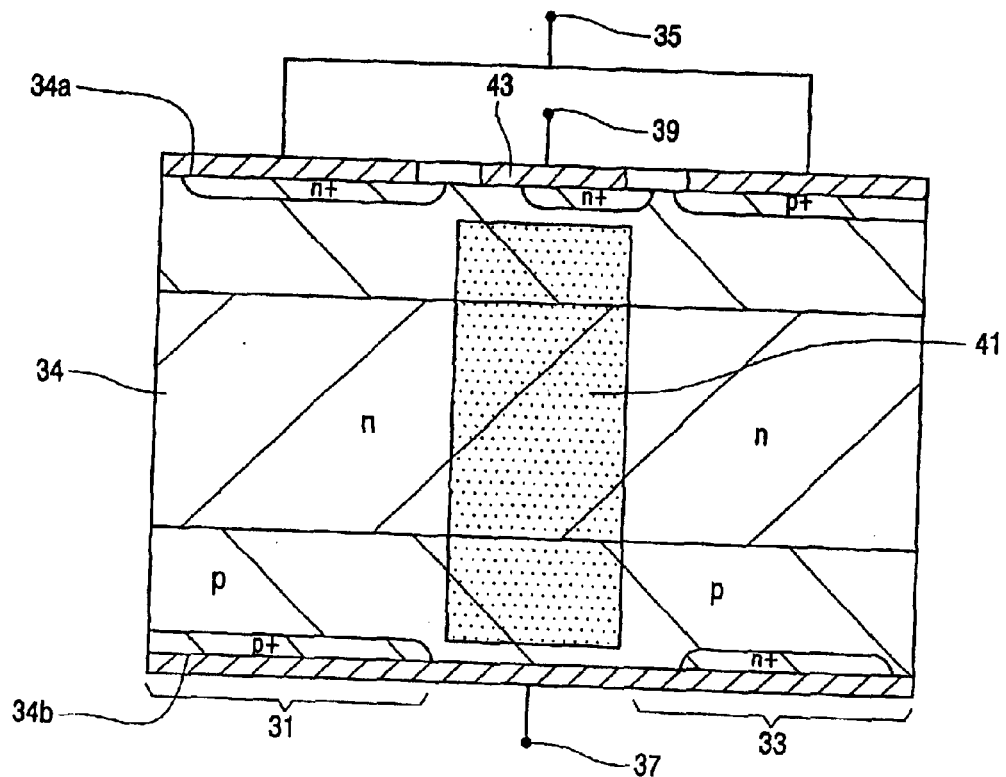
FIG. 4 is a cross-sectional view of a triac in accordance with the invention.

It will be appreciated that the techniques disclosed herein are applicable in various other devices where a localised region of lower carrier lifetime is desirable. For example, triacs and lifetime control therein are described in Baliga at pages 322 to 331, the contents of which are hereby incorporated herein as reference material. It is noted on page 330 that the operating frequency of triacs may be increased by selective lifetime reduction. Whilst it is suggested that masked electron irradiation may be used to define a suitable region, the present invention provides an alternative approach in which standard photolithography and implantation techniques may be used. Electron irradiation involves relatively high energies which are more expensive and difficult to mask. A triac including a low lifetime zone is illustrated in FIG. 4, the configuration of which corresponds to the device shown in FIG. 6.55 of Baliga. Its structure will not therefore be described in detail here. In short, it can be seen that this triac configuration comprises two thyristors 31 and 33 which are integrated back-to-back in a semiconductor body 34 into a single monolithic structure. Typically, terminal 35 is used as the reference (ground) terminal and terminal 37 is connected to the load, whilst terminal 39 provides a connection to the gate electrode 43.

A low lifetime zone is provided in the form of a region 41, doped with carbon and gold atoms. It extends vertically below the gate electrode 43 and between the thyristors 31 and 33. This region may be formed by diffusion or implantation of carbon and then gold atoms through either or both the top and bottom major surfaces 34a, 34b, respectively, of the semiconductor body 34. These processes are carried out before metallisation of the semiconductor body to form the electrodes of the device. The introduction of the carbon and gold is masked using known techniques to confine the atoms laterally within the semiconductor body. The same mask may be used for the incorporation of both species.

Figure 5:
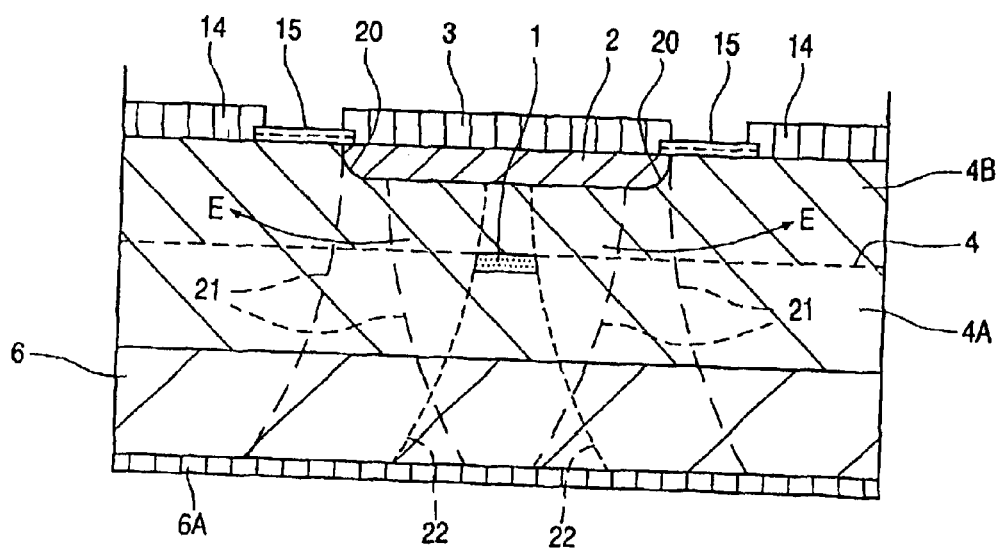
FIG. 5 is a cross-sectional view of part of a bipolar transistor in accordance with the invention.

A further application of the present invention is in bipolar semiconductor devices such as transistors and thyristors. Inclusion of shorter lifetime regions in these devices to reduce the occurrence of secondary breakdown is described in U.S. Pat. No. 4,754,315 (our reference PHB33139), the contents of which are hereby incorporated herein as reference material. FIG. 5 of the present specification is substantially a reproduction of FIG. 1 of U.S. Pat. No. 4,754,315, which is one of the examples disclosed therein of a shorter lifetime region 1 incorporated in such a device. The techniques of the present invention may be employed to provide a shorter lifetime region to obtain the benefits described in U.S. Pat. No. 4,754,315.

The bipolar transistor shown in FIG. 5 has the well known structure of interdigitated emitter and base regions 2, 4, and the Figure shows a section at right angles to one finger of the emitter region 2 and the surrounding base region 4 which are interdigitated. Insulating oxide layers 15 are provided between the emitter electrode 3 and base electrodes 14. Connection to the collector region 6 is made via a collector electrode 6A.

A method for the manufacture of the configuration of FIG. 5 is described in detail in U.S. Pat. No. 4,754,315 and so will not be included here. It describes formation of the region 1 by argon ion implantation to create carrier recombination centres. This is carried out after deposition of the first epitaxial layer 4A and before deposition of the second epitaxial layer 4B. According to the present invention, implantation or diffusion of carbon and then gold atoms is carried out at this stage instead of the argon implantation step, using a suitable mask to confine the region laterally to be below the eventual location of the emitter 3.

When the transistor is on, the active edges of the emitter region are the edges 20 closest to the base electrodes 14. The boundaries of the current path from the emitter region active edges to the collector electrode 6A are marked by dashed lines 21. When the transistor is turning off, the extraction of carriers from the base region by the base electrodes, in a direction indicated by arrows E, pinches the part of the base region through which a transient current can flow towards the centre of the emitter region, with a consequential pinch effect on the current path in the collector, and the boundaries of this pinched current path are marked by dashed lines 22.

It will be seen that the region 1 is placed within the current path which occurs during device turn-off and acts by causing carrier recombination to isolate the emitter region 2 from the collector region 6 thus opposing the onset of second breakdown by causing the transient current to collapse. The depth of the region 1 and the concentration of recombination centres within the region may be varied to tailor the effect of the region 1 to the likelihood of the onset of second breakdown at any part of a device structure.

The techniques described herein may also be advantageously used in the manufacture of trench-gate power transistors. As disclosed in co-pending United Kingdom Patent Application No. 0127478.4 (of the present applicant), the contents of which are hereby incorporated herein as reference material, switching losses may be reduced in such devices by incorporating a substantially intrinsic region below the trench which extends from the bottom of the trench, substantially across the drain drift region towards the drain contact region. Such a substantially intrinsic region may be created during the fabrication of the device after the trench has been etched into the semiconductor body of the device but before the formation of a gate electrode in the trench. At this stage, implantation and/or diffusion of carbon and then gold atoms into the base of the trench whilst the remainder of the substrate upon which the atoms are incident is shielded using a suitable mask provides a region of recombination centres substantially laterally localised and confined below the trench.

Further examples of semiconductor devices in which the present invention may be employed to provide localised regions with reduced carrier lifetimes are described in DE-A-10014659, and EP-A-1098371, the contents of which are hereby incorporated herein as reference material.

From reading the present disclosure, other variations and modifications will be apparent to persons skilled in the art. Such variations and modifications may involve equivalent and other features which are already known in the art, and which may be used instead of or in addition to features already described herein.

For example, reference has been made above to the use of gold or platinum atoms as lifetime controlling impurities, and they are widely used in this manner. Nevertheless, it will be appreciated that a large number of other impurities known in the art could be used to control carrier lifetime.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to such features and/or combinations of such features during the prosecution of the present Application or of any further Application derived therefrom.

What is claimed is:

1. A semiconductor device having a semiconductor body formed substantially of silicon, the body containing a silicon substrate comprising carbon introduced during bulk growth of said silicon substrate and an active device area in which charge carriers flow during operation of the device, and the active device area including a region having a predetermined concentration of said carbon, wherein a lifetime controlling impurity is provided in the body which is substantially located in the carbon region.

2. A device claim 1 wherein the concentration profile of the impurity of the carbon region substantially corresponds to that of the carbon.

3. A device of claim 1 wherein the carbon is substantially laterally confined.

4. A device of claim 1 wherein the carbon is substantially vertically confined.

5. A device of claim 1 wherein the carbon region is located in an epitaxial layer.

6. A device of claim 1 comprising a power rectifier including a portion of a first conductivity type overlying a portion of a second conductivity type, the portions defining a junction therebetween.

7. A device of claim 6 wherein the carbon region includes at least part of the junction.

8. A device of claim 6 wherein the carbon region is located below the junction.

9. A device of claim 1 comprising a triac including two thyristors wherein the carbon region extends between the thyristors.

10. A device of claim 1 comprising a bipolar semiconductor device, wherein the semiconductor body comprises an emitter region and a base region, wherein the carbon region is provided within the base region, substantially beneath the emitter region.

11. A method of manufacturing a semiconductor device having a semiconductor body formed substantially of silicon, the body containing a silicon substrate and an active device area in which charge carriers flow during operation of the device, the method comprising the steps of introducing carbon during bulk growth of said silicon substrate, providing a region in the active device area having a predetermined concentration of said carbon, and heating the body such that a lifetime controlling impurity within the body becomes substantially located in the carbon region.

12. A method of claim 11 including the step of introducing the lifetime controlling impurity into the body prior to the heating step.

* * * * *